United States Patent [19]

Aigo

[11] Patent Number: 5,083,381
[45] Date of Patent: Jan. 28, 1992

[54] METHOD AND APPARATUS FOR DRYING SEMICONDUCTOR MATERIALS

[76] Inventor: Seiichiro Aigo, 3-15-13, Negishi, Daito-ku, Tokyo, Japan

[21] Appl. No.: 652,537

[22] Filed: Feb. 8, 1991

[30] Foreign Application Priority Data

Feb. 15, 1990 [JP] Japan .................................. 2-35635

[51] Int. Cl.⁵ .............................................. F26B 5/08
[52] U.S. Cl. .................................. 34/8; 34/58; 34/59
[58] Field of Search ............................ 34/58, 59, 8

[56] References Cited

U.S. PATENT DOCUMENTS

| | | | |
|---|---|---|---|
| 4,525,938 | 7/1985 | Aigo | 34/58 |
| 4,559,718 | 12/1985 | Tadokoro | 34/8 |
| 4,637,146 | 1/1987 | Motoki et al. | 34/58 |
| 4,651,440 | 3/1987 | Karl | 34/58 |
| 4,724,619 | 2/1988 | Poli et al. | 34/58 |
| 4,735,000 | 4/1988 | Hayashi et al. | 34/8 |

*Primary Examiner*—Henry A. Bennett
*Assistant Examiner*—Denise L. F. Gromeda
*Attorney, Agent, or Firm*—Wegner, Cantor, Mueller & Player

[57] ABSTRACT

In a spin-dryer having a rotor on which semiconductor wafers to be dryed are set, nitrogen gas is released at a low rate to enclose the rotor in a nitrogen gas atmosphere from the arrangement of the semiconductor wafers on the rotor until the start of the spinning of the rotor, and then at a relatively high rate from the start of the spinning of the rotor or from immediately before the start of the spinning, in order to dry the semiconductor wafers without oxidation. The downward flow of air into the rotor is prevented for a prset time period from the start of the spinning of the rotor or from immediately before the start of the spinning. Air is then caused to flow into the rotor after an elapse of the preset time period.

6 Claims, 3 Drawing Sheets

METHOD AND APPARATUS FOR DRYING SEMICONDUCTOR MATERIALS

BACKGROUND OF THE INVENTION

1. Field of the Invention

The present invention relates to a method and apparatus for drying semiconductor materials, such as silicon wafers or glass photomasks, placed in a carrier by mounting the carrier on a rotor and spinning the rotor, whereby water droplets stuck on surfaces of the semiconductor materials are removed and dried by centrifugal force.

2. Description of the Related Art

Spin dryers have conventionally been used for removing water from semiconductor materials and drying the semiconductor materials. These spin dryers are each constructed of a spin dryer main body, which comprises a rotor to be driven and spun and a casing enclosing a periphery and bottom part of the rotor, and a filter box disposed openably on the casing. Semiconductor materials are dried by closing the filter box and spinning the rotor. Namely, water stuck on surfaces of the semiconductor materials is outwardly blown off by centrifugal force developed as a result of spinning of the rotor. In addition, the spinning of the rotor produces a negative pressure in a central zone of the rotor, whereby air is drawn downwardly toward the rotor. The air so drawn then passes through the filter box so that the air is filtered. This filtered air next enters the rotor and flows radially and outwardly from the central zone of the rotor. The air thereafter flows out through an exhaust port formed in the casing which encloses the rotor. The semiconductor materials on the rotor are dried by such an air stream. The semiconductor materials to be dried in the above manner are however those washed with purified water immediately before the drying. In the state mounted on the rotor for spin-drying, water therefore still remains on the carrier and the individual semiconductor materials placed therein, leading to problems as will be described next.

Because it takes some time until semiconductors are placed in a spin dryer and is dried after their washing, the semiconductor materials are oxidized by purified water still remaining on their surfaces during this period. Where the semiconductor materials are memory devices, bit errors may be produced at gate regions, resulting in the drawback that their function as a memory may be impaired. Further, the diffusion rate of a dopant may become uneven in diffusing contact well regions so that control of the concentration of the dopant thus diffused may become difficult. In addition, in the case of aluminum wiring, there are problems such as the occurrence of disconnection and short circuits.

SUMMARY OF THE INVENTION

An object of the present invention is therefore to overcome the above-described problems of the related art and hence to provide a drying method for a semiconductor material, said method being capable of protecting the semiconductor material from oxidation by purified water still remaining on its surface before drying, and an apparatus for suitably practicing the method.

In one aspect of the present invention, there is thus provided a method for drying a semiconductor material placed in a carrier by mounting the carrier on a rotor in a main body of a spin dryer and then spinning the rotor so that water stuck on the semiconductor material is removed by centrifugal force thus developed and the semiconductor material is dried by an air stream drawn downwardly into the rotor and then flowing out radially and outwardly from a central zone of the rotor owing to the spinning of the rotor. The nitrogen gas is released at a low rate to enclose the rotor in a nitrogen gas atmosphere from the arrangement of the semiconductor material on the rotor until the start of the spinning of the rotor, nitrogen gas is released at a relatively high rate from the start of the spinning of the rotor or from immediately before the start of the spinning of the rotor, the downward flow of air into the rotor is prevented for a preset time period from the start of the spinning of the rotor or from immediately before the start of the spinning of the rotor, and air is then caused to flow into the rotor after an elapse of the preset time period.

In another aspect of the present invention, there is also provided a dryer comprising a spin dryer main body and a filter box, said main body being composed of a rotor arranged for spinning and adapted to support thereon a semiconductor material placed in a carrier and a casing enclosing therein a periphery and lower part of the rotor, said filter box being disposed on the casing and having an annular filter medium, a top wall provided above the filter medium and a case composed a peripheral wall arranged around the filter medium with an interval therebetween and a bottom wall provided below the filter medium, whereby air is drawn into the rotor through a spacing between the top wall and the peripheral wall and through the filter medium upon spinning of the rotor. The filter box has a lid, which is arranged above the top wall and the case, and a drive means for vertically moving the lid. The lid is constructed air-permeable at an outer peripheral portion thereof and air-impermeable inside the outer peripheral portion thereof. The dryer further comprises a flexible, sheet-like sealing member provided between the peripheral wall of the case and an outer periphery of the lid, a seal for sealing a spacing between an inner periphery of the outer peripheral portion of the lid and the top wall when the lid has been moved downwardly, and a nitrogen gas feed line for releasing nitrogen gas toward the rotor.

From the arrangement of the semiconductor material, which is placed in the carrier, on the rotor until the start of the spinning of the rotor, nitrogen gas is released at the low rate around the rotor so that the rotor is enclosed in a nitrogen gas atmosphere. It is hence possible to prevent contact of the semiconductor material with air even when the semiconductor material has been brought close to the rotor. In addition, until the preset time period elapses, the flow of air into the rotor is prevented and nitrogen gas is instead caused to flow at the relatively high rate, whereby contact of the semiconductor material with air is prevented. Since water stuck on the semiconductor material has been removed substantially by that time, any subsequent contact of the semiconductor material with air will not result in oxidation. Accordingly, air is then introduced as in the conventional art to dry the semiconductor material.

According to the dryer of the present invention, the semiconductor material is arranged on the rotor, followed by the spinning of the rotor. Until the preset time period elapses, the lid of the filter box is lowered and the spacing between the inner periphery of the outer peripheral portion of the lid and the top wall is sealed, in other words, in the state that the flow of air into the rotor is stopped, nitrogen gas is fed at a relatively high rate through the nitrogen gas feed line to produce a nitrogen gas atmosphere in the rotor so that the semiconductor material is dried in a state prevented from contacting with air. Preferably, the supply of the nitrogen gas is next stopped at a certain time point, and after an elapse of the above preset time period, the lid of the filter box is lifted. This allows air to downwardly flows into the rotor after passing through the spacing between the top wall and the peripheral wall of the lid and then through the filter medium. The semiconductor material is hence dried by this air stream.

As has been described above, according to the present invention, a semiconductor material is maintained in a nitrogen gas atmosphere in the initial stage that a great deal of water is still stuck on surfaces of the semiconductor material. From the start of spinning of the rotor or from immediately before this time until an elapse of a preset time period, air is prevented from flowing in and spin-drying of the semiconductor material is performed in the nitrogen gas atmosphere. The water stuck on the semiconductor material until that time is substantially removed and the semiconductor is hence dried. Subsequent contact of the semiconductor material with air does not cause oxidation because water still remaining on the semiconductor material is only in an extremely small amount. It is therefore possible to conduct spin-drying of the semiconductor material without oxidation, so that deleterious effects by oxidation, such as migration, can be prevented.

BRIEF DESCRIPTION OF THE DRAWINGS

The above and other objects, features and advantages of the present invention will become apparent from the following description and the appended claims, taken in conjunction with the accompanying drawings, in which:

DETAILED DESCRIPTION OF THE INVENTION AND PREFERRED EMBODIMENTS

Figure 1:
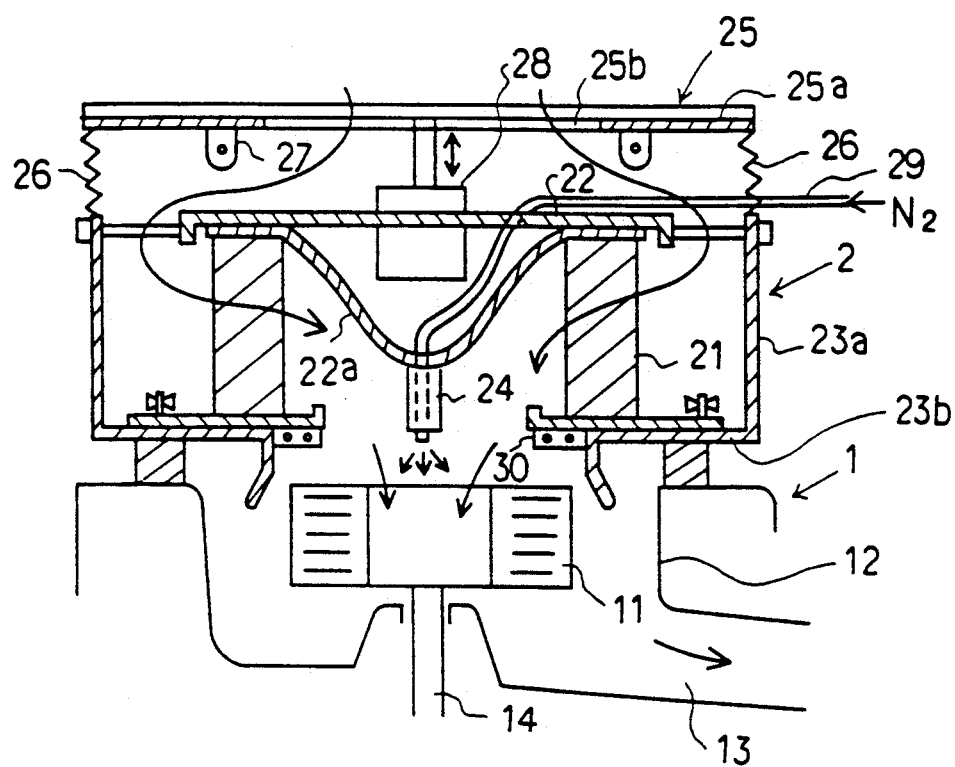
FIG. 1 is a vertical cross-section of a dryer according to one embodiment of the present invention.
Figure 2:
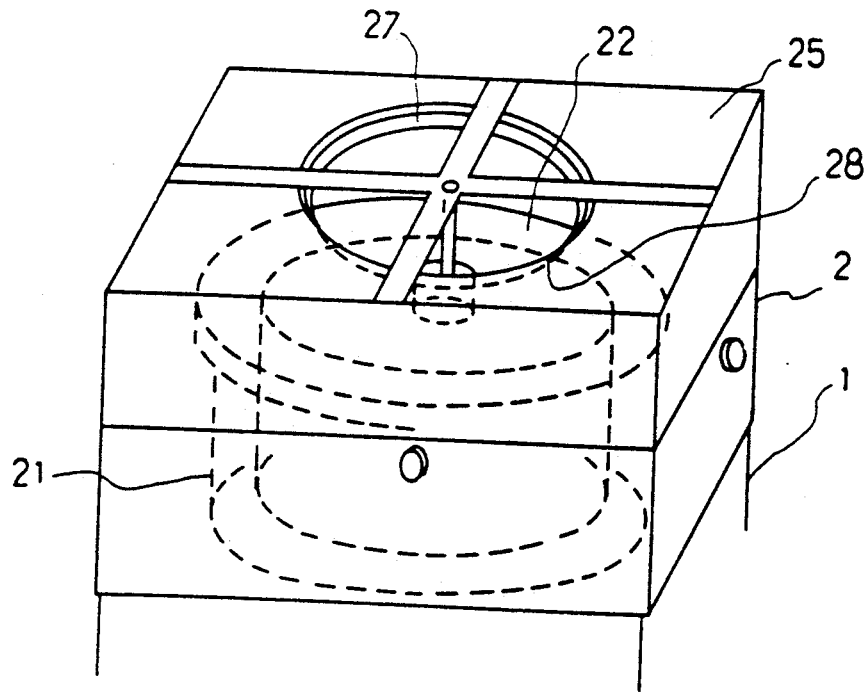
FIG. 2 is a fragmentary, perspective view of the dryer.

Certain embodiments of the present invention will next be described with reference to the drawings. FIGS. 1 and 2 illustrate one example of spin dryers suitable for use in the practice of the drying method. The spin dryer is constructed of a spin dryer main body 1, which comprises a rotor 11 and a casing 12 enclosing a periphery and bottom part of the rotor 11, and a filter box 2 disposed openably on the spin dryer main body 1.

The drying method can be followed to suitably conduct spin-drying of semiconductor materials by using such a spin dryer. A carrier, which contains a suitable number of the semiconductor materials (wafers) to be handled as a single lot, is arranged on the rotor 11 by way of an unillustrated cradle mounted on the rotor 11. The rotor 11 is then spun, whereby the semiconductor materials are dried by centrifugal force caused by the spinning of the rotor 11 and an air stream flowing through the rotor. Here, water stuck on the semiconductor materials are thrown off radially and outwardly and removed by the centrifugal force, and a negative pressure is produced inside the rotor 11. The air stream to be drawn into the rotor is filtered as it passes through an annular filter medium 21 accommodated in the filter box 2. The air stream downwardly enters a central zone of the rotor 11 and then radially and outwardly flows. Here, the air stream is brought into contact with the semiconductor materials so that the semiconductor materials are dried. The air stream is then guided by a peripheral wall of the casing 12 and is allowed to flow out through an exhaust port 13.

The feature of the drying method according to this invention resides in the prevention of contact of the semiconductor materials with air in an initial stage of their drying operation, namely, in the state that substantial water is still stuck on the semiconductor materials. To achieve this, nitrogen gas is released at a low rate toward the rotor 11 or around the rotor 11 while the carrier with the semiconductors placed therein is being mounted on the rotor 11 and until or immediately before spinning of the rotor 11 is started to enclose the rotor 11 in a nitrogen gas atmosphere. The release rate of nitrogen gas at this time may be 10–15 l/min by way of example.

Figure 3:
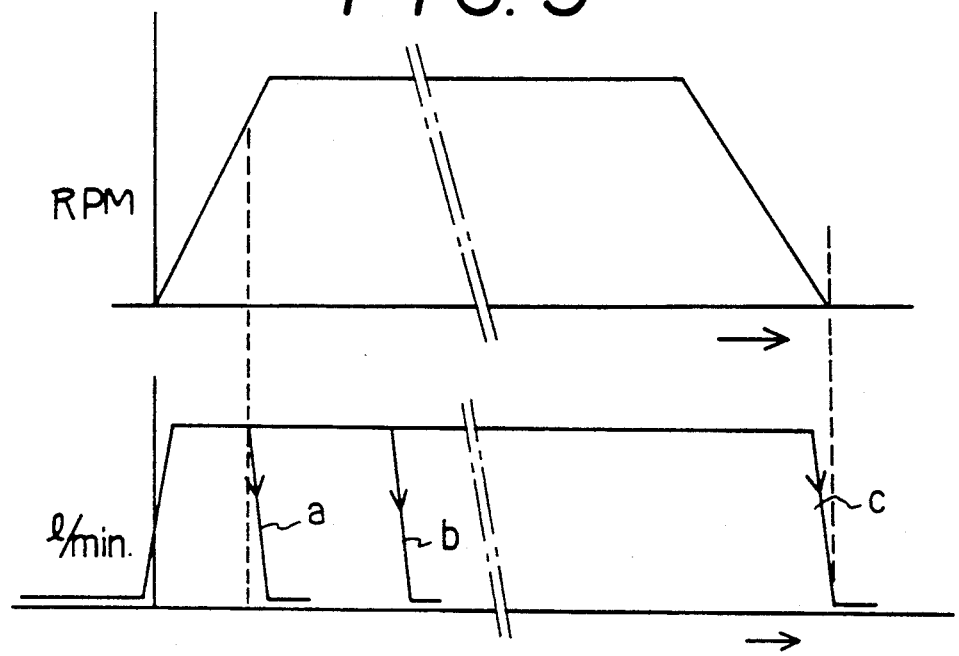
FIG. 3 is a graph showing a relationship between the speed of a rotor and the flow rate of nitrogen gas in a drying operation.

In the next stage, namely, for a preset time period from the start of the spinning of the rotor or from immediately before the start of the spinning of the rotor, air is prevented from downwardly flowing into the rotor. Further, for at least a predetermined time period from the start of the spinning of the rotor or from immediately before the start of the spinning of the rotor, nitrogen gas is released toward the rotor at a relatively high rate, for example, at 100–500 l/min. The maximum spinning speed of the rotor of a spin dryer of this type is generally about 800–1,200 rpm. It is possible to feed nitrogen gas until the rotor is stopped, provided that the economy can be sacrificed to certain extent because nitrogen gas is costly (FIG. 3, curve c). It is however preferable to shut off nitrogen gas at a certain time point before the stopping of the rotor (FIG. 3, curve b). From the economical standpoint, it is most preferable to shut off nitrogen gas at a time point immediately before the rotor reaches a maximum speed, for example, when the rotor has reached 600–700 rpm (FIG. 3, curve a).

After the preset time period has elapsed from the start of the spinning of the rotor 11 or from immediately before the start of the spinning of the rotor, air is downwardly drawn into the rotor and the semiconductor materials are then dried in a similar manner as in the conventional art. Incidentally, nitrogen gas can be allowed to continuously flow even after the speed of the rotor has exceeded a predetermined level.

Accordingly, in an initial stage of drying, namely, for the preset time period from the start of the spinning of the rotor, the semiconductor materials are maintained in the nitrogen gas atmosphere and are thus prevented from contact with air. Since water stuck on the semiconductor materials is substantially removed in such an initial stage of drying, the semiconductor materials are not oxidized even in any subsequent contact with air so that their oxidation in the drying step can be prevented adequately.

The dryer of the present invention, which is suitable for use in the practice of the above drying method, is composed of the spin dryer main body 1, which has the rotor 11 and the casing 12, and the filter box 2 disposed on the spin dryer main body 1 as shown in FIG. 1 and FIG. 2. The rotor 11 is driven and spun by a motor (not shown) by way of a drive shaft 14. The filter box 2 is constructed of the annular filter medium 21, a top wall 22 fixed above the filter medium, and a case 23 composed of a peripheral wall 23a provided around the filter medium 21 with an interval left therebetween and a bottom wall 23b provided below the filter medium 21. A HEPA (high efficiency particulate air) filter, an ULPA (ultra high efficiency particulate air) filter or the like can be used as the filter medium 21. The filter medium 21 is composed of a fibrous material and a separator. Preferably, a downwardly convex guide plate 22a can be arranged on a lower surface of the top wall 22, whereby air flowing into the rotor is guided suitably. It is also preferable to arrange an ionizer 24 on a lower extremity of the guide plate so as to ionize the air which flows into the rotor.

Figure 4:
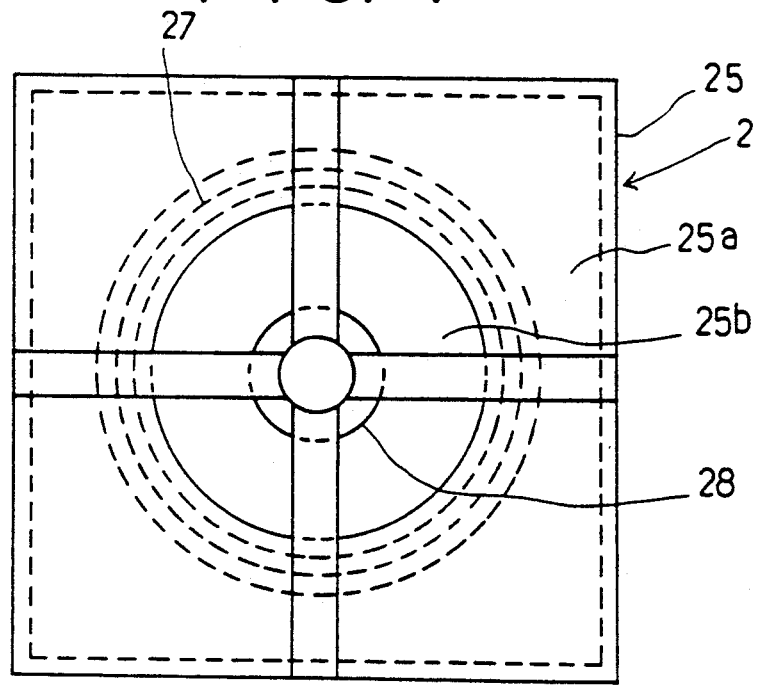
FIG. 4 is a plan view of the dryer.

The illustrated apparatus also includes a lid 25 disposed movably up and down over the top plate 22 and the case 23 and, in association with the lid, bellows 26, a seal 27 and a drive means 28 for moving the seal 27 and the lid 25 up and down. As is illustrated in FIG. 4, the lid 25 has a square contour of the same dimensions as the case 23. An outer peripheral portion 25a of the lid 25 is formed of a thin plate or sheet, namely, is constructed air-impermeable. A portion 25b inside the outer peripheral portion 25a is preferably circular and is constructed air-permeable. Air which flows into the rotor is introduced through the inside portion. The bellows 26 are provided between a peripheral wall 23a of the case 23 and an outer periphery of the lid 25. The bellows 26 therefore serve to permit vertical movements of the lid 25 and also to prevent air from flowing into the rotor through the spacing between the lid 25 and the peripheral wall 23a of the case 23. Another flexible, sheet-like sealing member, for example, a resin sheet may be used instead of the bellows 26 if desired.

The seal 27 is constructed, for example, of a seal packing and is provided on an inner peripheral part of the outer peripheral portion 25a of the lid 25 or on the top wall 22, and serves to seal the spacing between the inner peripheral part and the top wall when the lid 25 is lowered. This seal 27 is arranged in an annular form as is seen in FIG. 4. Preferably, the drive means 28 is constructed of a single unit and is disposed centrally on the top wall 22. The drive means 28 may be constructed of an electromagnetic solenoid, an air cylinder or any other reciprocating device. A free end of a drive shaft of the drive means 28 is connected to a center of the lid 25.

Figure 6:
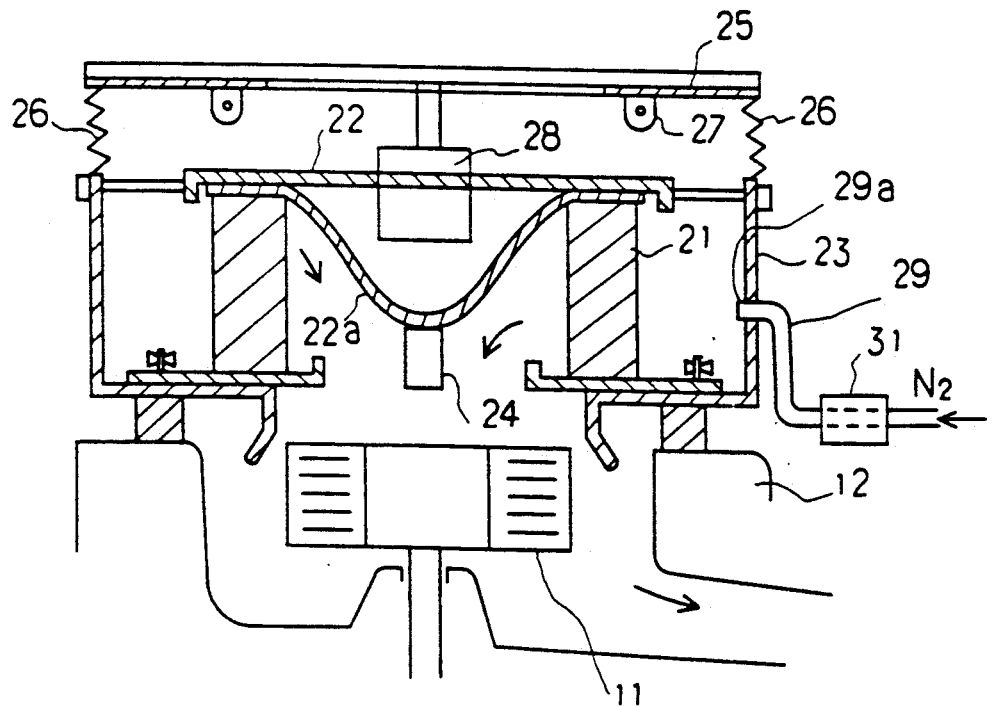
FIG. 6 is a fragmentary, vertical cross-section of a dryer according to another embodiment of the present invention.

In the illustrated apparatus, a nitrogen gas feed line 29 is also provided to release nitrogen gas toward or around the rotor. In the illustrated embodiment, the nitrogen gas feed line 29 is provided through the top wall 22 and a free end portion (release portion) of the nitrogen gas feed line 29 extends through a central part of the ionizer 24. Preferably, the free end portion (release portion) of the nitrogen gas feed line is provided in a space between the seal 27 and the filter medium 21, for example, through the peripheral wall 23a as shown in FIG. 6. This arrangement results in drawing of nitrogen gas through the filter medium 21, so that abrupt drawing is prevented when air is caused to flow in subsequently. As a result, the filter medium is protected from deleterious effects and its service life can be prolonged. Preferably, to heat nitrogen gas, the rotor 11 and its vicinity area, a heater 30 such as an electric heater or quartz lamp heater can be provided around an opening of the bottom wall 23 of the filter box 2 as shown in FIG. 1. It is also possible, if desired, to arrange a heater 31 at an intermediate portion of the feed line 29 as depicted in FIG. 8, instead of the heater 30. Accordingly, nitrogen gas can be heated before its release. Heating of nitrogen gas can bring about the advantage that drying of semiconductor materials can be performed more promptly in the initial stage.

Figure 5:
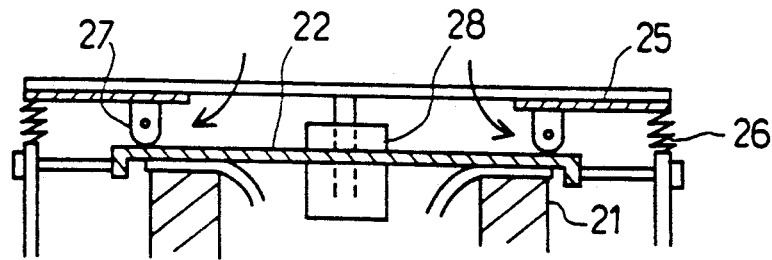
FIG. 5 is a fragmentary cross-section of the dryer in operation.

According to the dryer, nitrogen gas is released at a low rate from the nitrogen gas feed line 29 to enclose the rotor 11 in a nitrogen gas atmosphere in a preparatory stage before operation of the dryer, namely, from arrangement of semiconductor materials placed in the carrier on the rotor until spinning of the rotor is started. The lid 25 is then lowered by the drive means 28 to seal, by the seal 27, the spacing between the outer peripheral portion 25a of the lid 25 and the top wall 22 as illustrated in FIG. 5, thereby preventing air from flowing into the rotor for a preset time period after the start of the spinning of the rotor. During this preset time period, nitrogen gas is released at a relatively high rate from the feed line 29. In this stage, the semiconductor materials are therefore dried in the state that their contact with air is prevented. Upon an elapse of the preset time period, the lid 25 is lifted by the drive means 28 as illustrated in FIG. 1 so that the rotor is allowed to draw air therein and the semiconductor materials are dried by the resulting air stream. Although it is preferable to shut off nitrogen gas after the preset time period has elapsed, nitrogen gas may be continuously allowed to flow in some instances.

I claim:

1. A method for drying a semiconductor material placed in a carrier using a spin dryer having a rotor disposed in a main body and a filter box through which air can be drawn into the main body by rotation of the rotor, wherein the air flow into the main body through the filter box can be selectively prevented, said method comprising the steps of:

mounting the carrier on the rotor;
   releasing nitrogen gas into the main body at a relatively low rate;
   beginning rotation of the rotor to remove water stuck on the semiconductor material by centrifugal force;
   preventing air flow into the main body through the filter box during a first predetermined time period beginning when rotation of the rotor has begun;
   releasing nitrogen gas into the main body at a relatively high rate during a second predetermined time period beginning when rotation of the rotor has begun; and
   allowing air flow into the main body through the filter box when the first predetermined time period has elapsed.

2. The method as claimed in claim 1, wherein said first predetermined time period is equal to said second predetermined time period.

3. The method as claimed in claim 2, wherein said first predetermined time period and said second predetermined time period are equal to a time until the rotor reaches a maximum speed.

4. A spin dryer for drying a semiconductor material placed on a carrier, comprising:

a main body comprising a cup-shaped casing and a rotor rotatably mounted in said cup-shaped casing so as to leave a top portion of the rotor exposed, wherein the rotor is adapted to hold the carrier thereon; and a filter box mounted on the cup-shaped casing so as to cover the top portion of the rotor, said filter box comprising a bottom wall having a central opening formed therein, a peripheral wall extending from a peripheral portion of said bottom wall, a top wall having a peripheral opening formed therein, an annular filter medium disposed between said top wall and said bottom wall and between said central opening and said peripheral opening, a vertically movable lid adapted to selectively allow or disallow air flow through said peripheral opening, wherein said lid comprises an air-permeable central portion and an air-impermeable outer peripheral portion, first sealing means for sealing between the outer peripheral portion of the lid and the top wall when the lid is in a downward position, and second sealing means for sealing between the outer peripheral portion of the lid and the peripheral wall; and feed means for feeding nitrogen gas toward the rotor in said main body.

5. A spin dryer as claimed in claim 4, further comprising heater means for heating the nitrogen gas, the rotor, and an area surrounding the rotor.

6. A spin dryer as claimed in claim 4, wherein said feed means comprises a nitrogen gas feed line, and wherein said spin dryer further comprises heater disposed along said nitrogen gas feed line for heating the nitrogen gas flowing therein.

* * * * *